United States Patent
Bergman (10) Patent No.: US 6,869,487 B1
(45) Date of Patent: Mar. 22, 2005

(54) PROCESS AND APPARATUS FOR TREATING A WORKPIECE SUCH AS A SEMICONDUCTOR WAFER

(75) Inventor: Eric J. Bergman, Kalispell, MT (US)

(73) Assignee: Semitool, Inc., Kalispell, MT (US)

( * ) Notice: Subject to any disclaimer, the term of this patent is extended or adjusted under 35 U.S.C. 154(b) by 135 days.

(21) Appl. No.: 09/621,028

(22) Filed: Jul. 21, 2000

Related U.S. Application Data (63) Continuation-in-part of application No. PCT/US99/08516, filed on Apr. 16, 1999, and a continuation-in-part of application No. 09/061,318, filed on Apr. 16, 1998, now abandoned, and a continuation-in-part of application No. 08/853,649, filed on May 9, 1997, now Pat. No. 6,240,933.
(60) Provisional application No. 60/145,350, filed on Jul. 23, 1999.

(51) Int. Cl.$^7$ .............................. B08B 3/04; B08B 3/10
(52) U.S. Cl. .............................. 134/3; 134/2; 134/19; 134/26; 134/30; 134/33; 134/31; 134/25.4; 134/902; 134/102.1; 134/102.2; 134/108; 134/111; 134/199
(58) Field of Search .............................. 134/2, 3, 25.4, 134/30, 31, 33, 41, 102.1, 102.2, 108, 111, 199, 902, 18, 19

(56) References Cited

U.S. PATENT DOCUMENTS

| | | |
|---|---|---|
| 4,186,032 A | 1/1980 | Ham |
| 4,695,327 A | 9/1987 | Grebinski |
| 4,749,440 A | 6/1988 | Blackwood et al. |
| 4,778,532 A | 10/1988 | McConnell et al. |
| 4,817,652 A | 4/1989 | Liu |
| 4,899,767 A | 2/1990 | McConnell et al. |
| 4,917,123 A | 4/1990 | McConnell et al. |
| 4,974,530 A | 12/1990 | Lyon |
| 5,032,218 A | 7/1991 | Dobson |
| 5,055,138 A | 10/1991 | Slinn |
| 5,063,609 A | 11/1991 | Lorimer |
| 5,071,485 A | 12/1991 | Matthews et al. |
| 5,105,556 A | 4/1992 | Kurokawa et al. |
| 5,120,370 A | 6/1992 | Mori et al. |
| 5,181,985 A | 1/1993 | Lampert et al. |
| 5,232,511 A | 8/1993 | Bergman |
| 5,234,540 A | 8/1993 | Grant et al. |
| 5,235,995 A | 8/1993 | Bergman et al. |
| 5,244,000 A | 9/1993 | Stanford et al. |
| 5,246,526 A | 9/1993 | Yamaguchi et al. |

(List continued on next page.)

FOREIGN PATENT DOCUMENTS

| | | |
|---|---|---|
| EP | 0 344 764 | 12/1989 |
| EP | 04302145 | 10/1992 |
| EP | 0 548 596 A2 | 6/1993 |

(List continued on next page.)

OTHER PUBLICATIONS

Abstract of JP 3041729 published Feb. 22, 1991.
Abstract of JP 1008630, published Jan. 12, 1989.

(List continued on next page.)

Primary Examiner—Zeinab El-Arini
(74) Attorney, Agent, or Firm—Perkins Coie LLP

(57) ABSTRACT

A novel chemistry, system and application technique reduces contamination of semiconductor wafers and similar substrates and enhances and expedites processing. A stream of liquid chemical is applied to the workpiece surface. Ozone is delivered either into the liquid process stream or into the process environment. The ozone is preferably generated by a high capacity ozone generator. The chemical stream is provided in the form of a liquid or vapor. A boundary layer liquid or vapor forms on the workpiece surface. The thickness of the boundary layer is controlled. The chemical stream may include ammonium hydroxide for simultaneous particle and organic removal, another chemical to raise the pH of the solution, or other chemical additives designed to accomplish one or more specific cleaning steps.

25 Claims, 7 Drawing Sheets

U.S. PATENT DOCUMENTS

| | | | |
|---|---|---|---|
| 5,248,380 A | 9/1993 | Tanaka | |
| 5,308,745 A | 5/1994 | Schwartzkopf | |
| 5,326,406 A | 7/1994 | Kaneko et al. | |
| 5,372,651 A | 12/1994 | Kodama | |
| 5,378,317 A * | 1/1995 | Kashiwase et al. | 438/704 |
| 5,415,191 A | 5/1995 | Mashimo et al. | |
| 5,464,480 A | 11/1995 | Matthews | |
| 5,503,708 A | 4/1996 | Koizumi et al. | |
| 5,520,744 A | 5/1996 | Fujikawa et al. | |
| 5,571,367 A | 11/1996 | Nakajima et al. | |
| 5,632,847 A | 5/1997 | Ohno et al. | |
| 5,647,386 A | 7/1997 | Kaiser | |
| 5,658,615 A | 8/1997 | Hasebe et al. | |
| 5,705,089 A | 1/1998 | Sugihara et al. | |
| 5,714,203 A | 2/1998 | Schellenberger et al. | |
| 5,749,975 A * | 5/1998 | Li et al. | 134/13 |
| 5,776,296 A | 7/1998 | Matthews | |
| 5,803,982 A | 9/1998 | Kosofsky et al. | |
| 5,832,177 A | 11/1998 | Shinagawa et al. | |
| 5,858,107 A | 1/1999 | Chao et al. | |
| 5,896,875 A | 4/1999 | Yoneda | |
| 5,911,837 A | 6/1999 | Matthews | |
| 5,944,907 A | 8/1999 | Ohmi | |
| 5,950,643 A | 9/1999 | Miyazaki et al. | |
| 5,964,952 A | 10/1999 | Kunze-Concewitz | |
| 5,964,954 A | 10/1999 | Matsukawa et al. | |
| 5,971,368 A | 10/1999 | Nelson et al. | |
| 6,146,469 A | 11/2000 | Toshima | |
| 6,249,933 B1 | 6/2001 | Berfield | |
| 6,267,125 B1 | 7/2001 | Bergman et al. | |
| 6,273,108 B1 | 8/2001 | Bergman et al. | |
| 6,299,696 B2 * | 10/2001 | Kamikawa et al. | 134/2 |
| 6,551,409 B1 | 4/2003 | DeGendt et al. | |

FOREIGN PATENT DOCUMENTS

| | | | |
|---|---|---|---|
| EP | 0548 596 | * | 6/1993 |
| EP | 0 587 889 A1 | | 3/1994 |
| EP | 0 702 399 | | 3/1996 |
| EP | 0 782 177 A2 | | 7/1997 |
| GB | 2 287 827 | | 9/1995 |
| JP | 52-12063 | | 4/1977 |
| JP | S61-004232 | | 1/1986 |
| JP | 62-117330 | | 5/1987 |
| JP | 63-110732 | | 5/1988 |
| JP | 401042129 | | 2/1989 |
| JP | H01-262627 | | 10/1989 |
| JP | 03-072626 | | 3/1991 |
| JP | H03-208900 | | 9/1991 |
| JP | H04-125927 | | 4/1992 |
| JP | H04-298038 | | 10/1992 |
| JP | 4-302144 | | 10/1992 |
| JP | 04-302145 | | 10/1992 |
| JP | 04-370931 | | 12/1992 |
| JP | 05-013398 | | 1/1993 |
| JP | 05-109686 | | 4/1993 |
| JP | 05-259139 | | 10/1993 |
| JP | 05-283389 | | 10/1993 |
| JP | 06-204130 | | 7/1994 |
| JP | 07-159980 | | 6/1995 |
| JP | 8-8222 | | 1/1996 |
| WO | WO 99/52654 | | 10/1999 |

OTHER PUBLICATIONS

Abstract of Japanese Appln. No. 63–16127 published Jul. 31, 1989.

Abstract of Japanese Appln. No. 52–100473 published Mar. 14, 1979.

Abstract of Japanese Appln. No. 1–192712 published Mar. 12, 1992.

Translation/Abstract of Japanese Appln. No. 1984–125760 published Jan. 10, 1986.

Heyns, M.M., et al. "New Wet Cleaning Strategies for Obtaining Highly Reliable Thin Oxides," MRP Symposium Proceedings on Materials Research Society, Spring Meeting, San Francisco, CA Apr. 12–13, 1993, p. 35 (1993).

Adler, Marilyn Grace and Hall, George Richard, "The Kinetics and Mechanism of Hydroxide Ion Catalyzed Ozone Decomposition in Aqueous Solution" *J.Am.Chem.Soc.,* vol. 72, pp. 1884–1886, 1950.

Nelson, Steve, "Ozonated water for photoresist removal" *Solid State Technology,* pp. 107–112 (Jul. 1999).

Christenson, Kurt K., et al. "Deionized Water Helps Remove Wafer Stripping 'Resist'–ance," www.precisioncleaningweb.com—*Precision Cleaning Web—Archives,* pp. 10–20 (Apr. 1998).

Sehested, K., et al., "Decomposition of Ozone in Aqueous Acid Solutions (pH 0–4)," *J. Phys. Chem.,* pp. 1005–1009 (1992).

Krusell, W.C. et al., "Cleaning Technology for High Volume Production of Silicon Wafers," *ECS Proc. of the First Int'l. Symposium on Cleaning Technology I Semiconductor Device Mfg.,* pp. 23–32 (Oct. 1989).

Vig, John R., "UV/Ozone Cleaning of Surfaces," *U.S. Army Elec. Tech. and Devices Lab.,* pp. 1–26.

Vig, John R., "UV/Ozone Cleaning of Surfaces: A Review," *Surface Contamination: Genesis, Detection, and Control,* pp. 235–253(1979).

Tong, Jeremy, et al., "Aqueous Ozone Cleaning of Silicon Wafers," *ECS Extended Abstracts,* Phoenix, AZ, Abstract No. 506, pp. 753 (Oct. 13–17, 1991).

Zafonte, Leo, et al., "UV/Ozone Cleaning For Organics Removal on Silicon Wafers," *SPIE Optical Microlithography III: Technology for the Next Decade,* vol. 470, pp. 164–175 (1984).

Baumgärtner, H., et al., "Ozone Cleaning of the SI–SIO$_2$ System," *Appl. Phys. A,* vol. 43, pp. 223–226 (1987).

Isagawa, Tatsuhiko, et al., "Ultra Clean Surface Preparation Using Ozonized Ultrapure Water," *Extended Abstracts of the 1982 Int'l. Conf. on Solid State Devices and Materials,* pp. 193–195 (1992).

Shimada, H., et al., "Residual–Surfactant–Free Photoresist Development Process," *J. Electrochem. Soc.,* 139(6):1721–1730 (Jun. 1992).

Tong, Jeremy K. et al., "Aqueous Ozone Cleaning of Silicon Wafers," *Proc. of 2$^{nd}$ Int'l. Symposium on Cleaning Tech In Semiconductor Device Mfg.,* pp. 18–25 (Oct. 1992).

Tong, Jeremy K., et al., "Aqueous Ozone Cleaning of Silicon Wafers," *Res. Soc. Symp.,* pp. 18–25 (1993).

Ohmi, T., et al., "Native Oxide Growth and Organic Impurity Removal on Si Surface with Ozone–Injected Ultrapure Water," *J. Electrochem. Soc.,* 140(3):804–810 (Mar. 1993).

Vig, John R., et al., "UV/Ozone Cleaning of Surfaces," *IEEE Transactions on Parts, Hybrids, and Packaging,* vol. PHP–12(4):365–370 (Dec. 1976).

Vig, John R., "UV/ozone cleaning of surfaces," *U.S. Army Electronics Technology and Devices Laboratory ERADCOM,* Ft. Monmouth, NJ, 07703–5302, pp. 1027–1034 (Sep./Oct. 1984).

Tabe, Michiharu, "UV ozone cleaning of silicon substrates in silicon molecular beam epitaxy," *Appl. Phys. Lett.,* 45(10):1073–1075 (Nov. 1984).

Zarrera, L.A., et al., "XPS and SIMS Study of Anhydrous HF and UV/Ozone–Modified Silicon (100) Surfaces," *J. Electrochem. Soc.,* 136(2):484–491 (Feb. 1989).

Gabriel, Calvin, et al., "Reduced Device Damage Using An Ozone Based Photoresist Removal Process," *SPIE Advances in Resist Technology and Processing VI,* vol. 1086, pp. 598–604 (1989).

Suemitsu, Maki, et al., "Low Temperature Silicon Surface Cleaning by HF Etching/Ultraviolet Ozone Cleaning (HF/UVOC) Method (I)–Optimization of the HF Treatment–," *Japanese Journal of Applied Physics,* 28(12):2421–2424 (Dec. 1989).

Kern, Werner, "The Evolution of Silicon Wafer Cleaning Technology," *J. Electrochem. Soc.,* 137(6):1887–1892 (Jun. 1990).

Kasi, S.R., et al., "Surface Hydrocarbon Removal from Si by UV/Ozone," *ECS Extended Abstracts,* No. 458, pp. 691–692 (199).

Kasi, Srinandan R., et al. "Vapor phase hydrocarbon removal of Si processing," *Appl. Phys. Lett.,* 57(20):2095–2097 (Nov. 1990).

Huynh, Cuc K., et al., "Plasma versus ozone photoresist ashing: Temperature effects on process–induced mobile contamination," *J. Vac. Sci. Technol.,* B9(2):353–356 (Mar./Apr. 1991).

Bedge, Satish, et al., "Kinetics of UV/$O_2$ Cleaning and Surface Passivation Experiments and Modeling," *Mat. Res. Soc. Symp. Proc.,* vol. 259, pp. 207–212 (1992).

Goulding, M.R., "The selective epitaxial growth of silicon," *Materials Science and Engineering,* vol. B17, pp. 47–67 (1993).

Ganesan, Gans S., et al., "Characterizing Organic Contamination in IC Package Assembly," *The Int'l. Soc. for Hybrid Microelectronics,* vol. 17, #2, Second Quarter, pp. 152–160 (1994).

Egitto, F.D., et al., "Removal of Poly(Dimethylsiloxane) Contamination From Silicon Surfaces With UV/Ozone Treatment," *Mat. Res. Soc. Symp. Proc.,* vol. 385, pp. 245–250 (1995).

Amick, J.A., "Cleanliness and the Cleaning of Silicon Wafers," *Solid State Technology,* pp. 47–52 (Nov. 1976).

Bolon, D.A., et al., "Ultraviolet Depolymerization of Photoresist Polymers," *Polymer Engineering and Science,* 12(2):108–111 (Mar. 1972).

Krusell, W.C., et al., "The Characterization of Silicon Substrate Cleaning Treatments by use of SIMS and MOS Electrical Testing," *ECS Extended Abstracts,* No. 229, p. 331–332 (1986).

Golland, D.E., et al., "The Clean Module: Advanced Technology for Processing Silicon Wafers," *Semiconductor Int'l.,* pp. 184–187 (Sep. 1987).

Anantharaman, Ven. Ph.D., et al., "ORGANICS: Detection and Characterization of Organics in Semiconductor DI Water Processes," *Ultrapure Water,* pp. 30–36 (Apr. 1994).

"Ozone Concentration Measurement in A Process Gas," *Proposed IOA Pan American Group Guideline,* pp. 1–21 (Dec. 1993).

"Ozone for Semiconductor Applications," *Sorbios,* pp. 1–6 (Oct. 1991).

\* cited by examiner

PROCESS AND APPARATUS FOR TREATING A WORKPIECE SUCH AS A SEMICONDUCTOR WAFER

This Application is a Continuation-in-Part of U.S. patent application Ser. No. 60/145,350, filed Jul. 23, 1999, abandoned. This Application is also a Continuation-in-Part of Ser. No. 09/061,318 filed Apr. 16, 1998, abandoned, and also of Ser. No. 08/853,649, filed May 9, 1997, now U.S. Pat. No. 6,240,933. Priority to these Applications is claimed under 35 U.S.C. §120. This Application is also a Continuation-in-Part of PCT/US99/08516, designating the United States Priority to PCT/US99/08516 is claimed under 35 U.S.C. §§120 and 365(c).

FIELD OF THE INVENTION

The cleaning of semiconductor wafers is often a critical step in the fabrication processes used to manufacture integrated circuits or the like. The geometries on wafers are often on the order of fractions of a micron, while the film thicknesses may be on the order of 20 Angstroms. This renders the devices highly susceptible to performance degradation due to organic, particulates or metallic/ionic contamination. Even silicon dioxide, which is used in the fabrication structure, can be considered a contaminant if the quality or thickness of the oxide does not meet design parameters.

Although wafer cleaning has a long history, the era of "modern" cleaning techniques is generally considered to have begun in the early 1970s when RCA developed a cleaning sequence to address the various types of contamination. Although others developed the same or similar processes in the same time frame, the general cleaning sequence in its final form is basically the same.

The first step of the RCA cleaning sequence involves removal of organic contamination using sulfuric acid and hydrogen peroxide mixtures. Ratios are typically in the range of 2:1 to 20:1, with temperatures in the range of 90–140 degrees Celsius. This mixture is commonly called "piranha." A recent enhancement to the removal of organic contamination replaces the hydrogen peroxide with ozone that is bubbled or injected into the sulfuric acid line.

The second step of the process involves removal of oxide films with water and HF (49%) in ratios of 200:1 to 10:1, usually at ambient temperatures. This processing typically leaves regions of the wafer in a hydrophobic condition.

The next step of the process involves the removal of particles and the re-oxidation of hydrophobic silicon surfaces using a mixture of water, hydrogen peroxide, and ammonium hydroxide, usually at a temperature of about 60–70 degrees Celsius. Historically, ratios of these components have been on the order of 5:1:1. In recent years, that ratio has more commonly become 5:1:0.25, or even more dilute. This mixture is commonly called "SC1" (standard clean 1) or RCA1 Alternati vely, it is also known as HUANG1. Although this portion of the process does an outstanding job of removing particles by simultaneously growing and etching away a silicon dioxide film on the surface of a bare silicon wafer (in conjunction with creating a zeta potential which favors particle removal), it has the drawback of causing metals, such as iron and aluminum, in solution to deposit on the silicon surface.

In the last portion of the process, metals are removed with a mixture of water, hydrogen peroxide, and hydrochloric acid. The removal is usually accomplished at around 60–70 degrees Celsius. Historically, ratios have been on the order of 5:1:1, but recent developments have shown that more dilute chemistries are also effective, including dilute mixtures of water and HCl. This mixture is commonly referred to as "SC2" (standard clean 2), RCA2, or HUANG2.

The foregoing steps are often run in sequence, constituting what is called a "pre-diffusion clean." Such a pre-diffusion clean insures that wafers are in a highly clean state prior to thermal operations which might incorporate impurities into the device layer or cause them to diffuse in such a manner as to render the device useless. Although this four-step cleaning process is considered to be the standard cleaning process in the semiconductor industry, there are many variations of the process that use the same sub-components. For example, the piranha solution may be dropped from the process, resulting in a processing sequence of: HF->SC1->SC2. In recent years, thin oxides have been cause for concern in device performance, so "hydrochloric acid last" chemistries have been developed. In such instances, one or more of the above-noted cleaning steps are employed with the final clean including hydrochloric acid in order to remove the silicon backside from the wafer surface.

The manner in which a specific chemistry is applied to the wafers can be as important as the actual chemistry employed. For example, HF immersion processes on bare silicon wafers can be configured to be particle neutral. HF spraying on bare silicon wafers typically shows particle additions of a few hundred or more for particles at 0.2 microns nominal diameter.

Although the four-chemistry clean process described above has been effective for a number of years, it nevertheless has certain deficiencies. Such deficiencies include the high cost of chemicals, the lengthy process time required to get wafers through the various cleaning steps, high consumption of water due to the need for extensive rinsing between chemical steps, and high disposal costs. The result has been an effort to devise alternative cleaning processes that yield results as good as or better than the existing four-chemistry clean process, but which are more economically attractive.

Various chemical processes have been developed in an attempt to replace the existing four-chemistry cleaning process. However, such cleaning processes have failed to fully address all of the major cleaning concerns of the semiconductor processing industry. More particularly, they have failed to fully address the problem of minimizing contamination from one or more of the following contaminants: organics, particles, metals/ions, and silicon dioxide.

STATEMENT OF THE INVENTION

A novel chemistry, application technique, and system is used to reduce the contamination and speed up processing in the manufacturing of semiconductor wafers, memory disks, photomasks, optical media, and other substrates (collectively referred to here as "wafers") requiring a high level of clean. Contamination may occur from organics, particles, metal/ions, and silicon dioxide. Cleaning of wafers is achieved by delivery of a chemical stream to the workpiece surface. Ozone is delivered either into the liquid process stream or into the process environment. The chemical stream, which may be in the form of a liquid or vapor, is applied to the wafer in a system which allows for control of the liquid boundary layer thickness. The chemical stream may include ammonium hydroxide for simultaneous particle and organic removal, another chemical to raise the pH of the solution, or other chemical additives designed to accomplish one or more specific cleaning steps.

Wafers are preferably placed in a standard Teflon wafer cassette, or in a centrifugal process chamber utilizing a "carrierless" rotor design. During processing, the wafers and/or cassette are preferably rotated in the chamber.

A processing solution is preferably heated and sprayed onto the wafer surface. This heats the surface of the wafer as well as the environment. If the spray is shut off, a thin liquid film remains on the wafer surfaces. However, preferably the liquid spray is continued for the duration of the chemical process step. If the wafer surface is hydrophobic, a surfactant may be added to the liquid chemical to create a thin film of liquid on the surfaces. The boundary layer of the processing solution at the wafer surface is advantageously controlled through the use of the rotation rate, the flow rate of the processing solution, and/or the injection technique (nozzle design) used to deliver the liquid (or steam) stream to the surfaces of the wafers.

Ozone is concurrently injected into the enclosed chamber during the liquid spray, either through the same manifold as the liquid delivery or through a separate manifold. Ozone injection may continue after the spray has shut off. If the wafer surfaces begin to dry (as in the case of a non-continuous spray), a brief spray may be used to replenish the liquid. This insures that the exposed wafer surfaces remain wetted at all times and that the elevated temperature at the wafer surfaces is also maintained. The process may also be used on a single wafer, rather than on an entire batch.

While ozone has a limited solubility in the hot liquid solution, it is still able to diffuse through the solution and react with the surface of the wafer (whether it is silicon, photoresist, etc.) at the liquid/solid interface. Thus diffusion, rather than dissolution, is the primary mechanism used to deliver ozone to the surfaces of the wafers. Water apparently helps to hydrolyze carbon—carbon bonds or accelerate the oxidation of silicon surfaces by hydrolyzing silicon-hydrogen or silicon-hydroxyl bonds. The elevated temperature promotes the reaction kinetics and the high concentration of ozone in the gas phase promotes diffusion of the ozone through the liquid film, even though the increased temperature of the liquid film does not result in a solution having a high concentration of ozone dissolved in it.

The flow of ozone can be delivered to the process chamber through a vapor generator or the like. Such a generator is filled with water, which is temperature controlled. Thus the ozone gas stream is enriched with water vapor which maintains the boundary layer on each wafer surface at a minimal thickness so that the layer does not inhibit diffusion. At the same time, such delivery assists in preventing the wafers from drying completely during the process.

A high capacity ozone generator is preferably used to produce a mixed effluent containing a high concentration of ozone in combination with a high flow rate. A higher concentration of ozone increases the quantity of ozone provided to the surface of the wafer. A higher flow rate increases the rate at which fresh reactants are replenished, and spent or exhausted reactants are carried away from the wafer.

Purely maximizing the concentration of ozone is not optimal for process performance, as the amount of ozone then generated is then too small to create an adequate concentration within the process chamber. On the other hand, simply maximizing flow rate or volume, without sufficient concentration will result in rapid depletion of ozone in the process chamber (as the ozone will react rapidly with organic materials in the process chamber). Thus, both high concentration and high flow rates are needed.

In known spray processing operations, wafer rotational speeds are in the range of 10–100 rpm. Such low speeds tend to allow a thick boundary layer of liquid to build up on the surfaces of the wafers to create a diffusion barrier, which, in turn, inhibits, the reaction rate. It has been found, however, that a continuous spray of liquid, such as the de-ionized water that is heated to maintain the surface temperature of the wafers, combined with high rotational speeds (>300 rpm), generates a very thin boundary layer that minimizes the diffusion layer thickness thereby leading to an enhanced stripping rate. It has also been found that increases in the rotational rate of the wafers during processing results in a corresponding increase in the strip rate. For example, an increase in the rotational rate from 300 to 800 rpm results in the strip rate increasing by a factor of 2 or more. A further increase to 1500 rpm has been seen to result in another two-fold increase. Rotation rates of up to 3000 rpm are anticipated.

To further enhance the process, the temperature of the liquid supply (water supply) can be heated to generate a supply of saturated steam under pressure to the process chamber. Under such circumstances, it is possible to achieve wafer surface temperatures in excess of 100 degrees Celsius, thereby further accelerating the reaction kinetics. A steam generator may be used to pressurize the process chamber to achieve the desired temperatures. For example, saturated steam at 126 degrees Celsius may be used with a corresponding increase in the pressure of the process chamber to 240 K Pa (35 psia). The increased pressure within the processing chamber also provides for use of higher ozone concentrations, thereby generating a higher diffusion gradient across the boundary layer at the surface of each wafer. Still further, the use of steam also allows for the use of lower rotation rates to achieve the requisite thin boundary layers at the surfaces of the wafers. The oxidation rate of the ozone may also be enhanced by irradiating the surfaces of the wafers with ultra-violet light.

The invention allows particles, metals, and organics to be removed in a single processing step. Further, it is now possible to regenerate a fresh, clean, controlled chemical oxide film in that same step. To this end, certain additives may be provided in the processing liquid to specifically target certain contaminants and/or to enhance the effectiveness of the overall process. For example, ammonium hydroxide may be added to the processing liquid (e.g., deionized water) to reduce particle counts on the workpieces. In such a process, the ozone prevents pitting of the silicon surface by the ammonium hydroxide.

Other additives that enhance the cleaning capability of the overall process include HF and HCl. Such additives have the following benefits/effects: 1) removal of organic contaminants; 2) removal of oxide and regeneration of a controlled chemical oxide; 3) removal of particles; 4) removal of metals.

After one or more of the foregoing cleaning process steps has been completed, the wafers are prepared for subsequent cleaning steps. The wafers are preferably rinsed with deionized water or a suitable aqueous solution. At this time, the ozone within the processing chamber may also be purged with, for example, a nitrogen flush.

If an additive that enhances the metal removal capabilities of the solution is not used, it may be desirable to execute a further processing step for metal removal. In one or more such cleaning steps, metal and/or silicon dioxide may be removed from the surfaces of the wafers by applying a temperature controlled mixture containing hydrofluoric acid and/or hydrochloric acid, chloroacetic acid, or other halogenated chemistry. Ozone may or may not be introduced into the liquid stream or the process environment during this step.

After one or more of the foregoing steps have been completed, including any intermediate cleaning steps, the wafers are subject to a final rinsing in deionized water or an aqueous solution. After the rinse, the wafers may be dried in a manner that may include the use of heated nitrogen, another inert gas flow, or organic vapors. Additionally, the wafers may be rotated during the drying process.

The disclosed process is applicable to various manufacturing steps that require cleaning or selective removal of contaminants from the surface of a workpiece. For example, one or more of the steps may be used to remove photoresist from the surface of a semiconductor wafer. A layer of photoresist and a corresponding layer of an anti-reflective coating (ARC) may be removed in a single processing step using a single processing solution. An aqueous solution having a high pH, such as a solution of ammonium hydroxide and/or tetra-methyl ammonium hydroxide and deionized water, may be used to form a controlled boundary layer that cooperate with ozone to remove both the photoresist and the anti-reflective coating.

Novel aspects include:
1) The use of a temperature controlled liquid chemical source delivered to the wafer surface to stabilize the temperature of the wafer and, depending on the liquid utilized, provide a supply of water to support hydrolysis of the carbon—carbon bonds of contaminants at the surface of each wafer.
2) The control of the thickness of the boundary layer of liquid present on the wafer surface so that it is not of sufficient thickness to significantly inhibit the diffusion of ozone to the wafer surface. As such, the ozone is allowed to diffuse through the controlled boundary layer, where it can oxidize silicon, organics, or metals at the surface, or otherwise support any desired reaction. The boundary layer may be controlled through the control of wafer rotation rate, vapor delivery, controlled liquid spray, the use of steam, the use of surfactants or a combination of more than one of these techniques.
3) The process takes place in an enclosed processing chamber, which may or may not be used to produce a pressurized processing environment.
4) The process utilizes a mixed effluent having a higher concentration of ozone in combination with a higher flow rate for increasing the rate at which fresh reactants are supplied to the surface of the wafer.

The invention resides as well in sub-combinations of the methods and apparatus.

DETAILED DESCRIPTION OF THE INVENTION

Apparatus for supplying a mixture of a treatment liquid and ozone for treatment of a surface of a workpiece, such as a semiconductor workpiece, to execute the foregoing processes are set forth below. The preferred embodiment of the apparatus comprises a liquid supply line that is used to provide fluid communication between a reservoir containing the treatment liquid and a treatment chamber housing the semiconductor workpiece. A heater heats the workpiece, either directly or indirectly. Preferably, the workpiece is heated by heating the treatment liquid that is supplied to the workpiece. One or more nozzles accept the treatment liquid from the liquid supply line and spray it onto the surface of the workpiece while an ozone generator provides ozone into an environment containing the workpiece.

Figure 1:
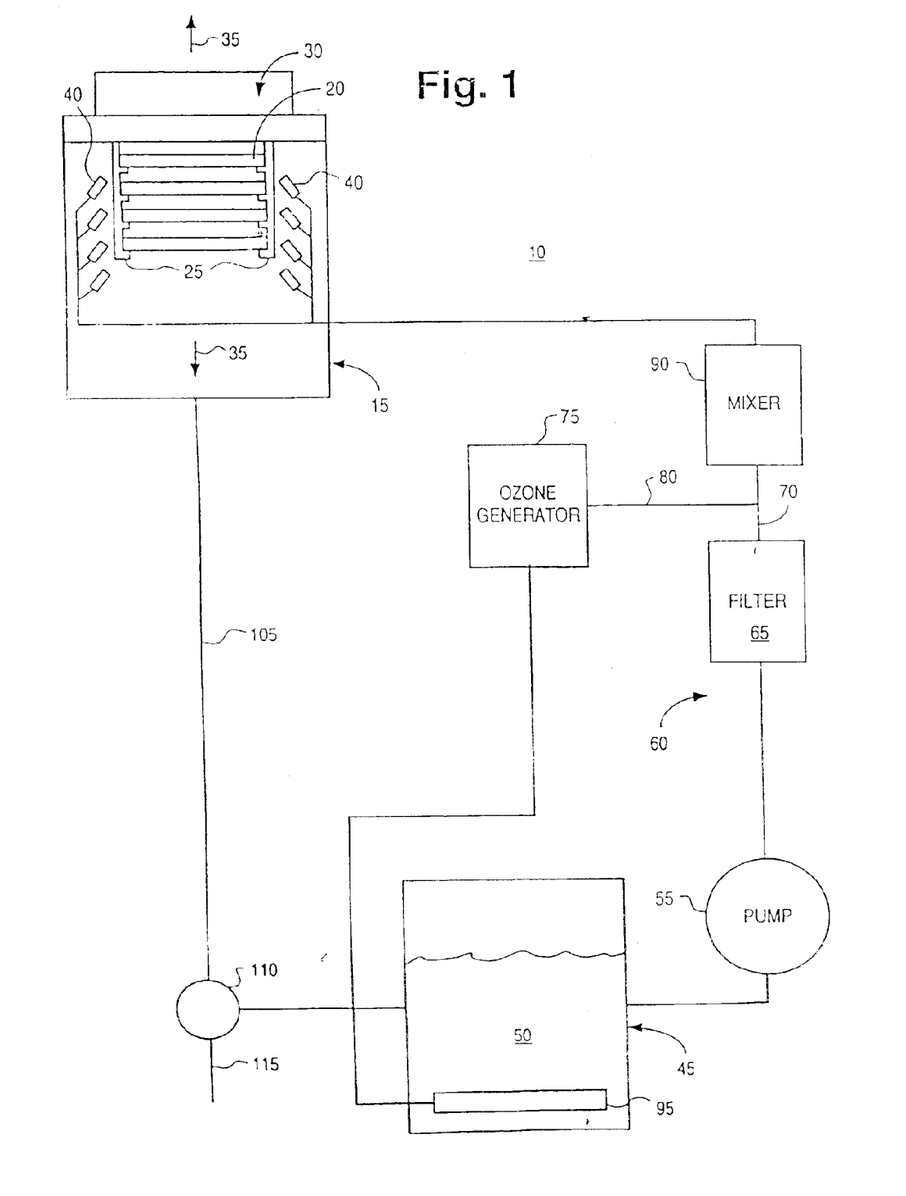
FIG. 1 is a schematic block diagram of one embodiment of an apparatus for treating a semiconductor workpiece in which ozone is injected into a line containing a pressurized treatment liquid.

Referring to FIG. 1, the treatment system, shown generally at 10, includes a treatment chamber 15 that contains one or more workpieces 20, such as semiconductor wafer workpieces. Although the illustrated system is directed to a batch workpiece apparatus, it is readily adaptable for use in single workpiece processing as well.

The semiconductor workpieces 20 are preferably supported within the chamber 15 by one or more supports 25 extending from, for example, a rotor assembly 30. Rotor assembly 30 may seal with the housing of the treatment chamber 15 to form a sealed, closed processing environment. Further, rotor assembly 30 is provided so that the semiconductor workpieces 20 may be spun about axis 35 during or after treatment with the ozone and treatment liquid.

The chamber 15 has a volume which is minimized, and is as small as permitted by design considerations for any given capacity (i.e., the number and size of the substrates to be treated). The chamber 15 is preferably cylindrical for processing multiple wafers in a batch, or a flatter disk-shaped chamber may be used for single wafer processing. Typically, the chamber volume will range from about 5 liters, (for a single wafer) to about 50 liters (for a 50 wafer system).

One or more nozzles 40 are disposed within the treatment chamber 15 to direct a spray mixture of ozone and treatment liquid onto the surfaces of the semiconductor workpieces 20 that are to be treated. In the illustrated embodiment, the nozzles 40 direct a spray of treatment fluid to the underside of the semiconductor workpieces 20. However, the fluid spray may be directed alternatively, or in addition, to the upper surface of the semiconductor workpieces 20. The fluid may also be applied in other ways besides spraying, such as flouring, bulk deposition, immersion, etc.

Treatment liquid and ozone are preferably supplied to the nozzles 40 by system components uniquely arranged to provide a single fluid line comprising ozone mixed with the treating liquid. A reservoir 45 defines a chamber 50 in which the liquid that is to be mixed with the ozone is stored. The chamber 50 is in fluid communication with, or connected to, the input of a pump mechanism 55. The pump mechanism 55 provides the liquid under pressure along a fluid flow path, shown generally at 60, for ultimate supply to the input of the nozzles 40. The preferred treatment fluid is deionized water. Other treatment fluids, such as other aqueous or non-aqueous solutions, may also be used.

Fluid flow path 60 may include a filter 65 to filter out microscopic contaminants from the treatment fluid. The treatment fluid, still under pressure, is provided at the output of the filter 65 (if used) along fluid flow line 70. Ozone is injected along fluid flow line 70. The ozone is generated by ozone generator 75 and is supplied along fluid flow line 80 under pressure to fluid flow line 70. Optionally, the treatment liquid, now injected with ozone, is supplied to the input of a mixer 90 that mixes the ozone and the treatment liquid. The mixer 90 may be static or active. From the mixer 90, the treatment liquid and ozone are provided to be input of nozzles 40 which, in turn, spray the liquid on the surface of the semiconductor workpieces 20 that are to be treated and, further, introduce the ozone into the environment of the treatment chamber 15.

To further concentrate the ozone in the treatment liquid, an output of the ozone generator 75 may be supplied to a dispersion unit 95 disposed in the liquid chamber 50 of the reservoir 45. The dispersion unit 95 provides a dispersed flow of ozone through the treatment liquid to thereby add ozone to the fluid stream prior to injection of a further amount of ozone along the fluid path 60.

In the embodiment of the system of FIG. 1, spent liquid in chamber 15 is provided along fluid line 105 to, for example, a valve mechanism 110. The valve mechanism 110 may be operated to provide the spent liquid to either a drain output 115 or back to the liquid chamber 50 of the reservoir 45. Repeated cycling of the treatment liquid through the system and back to the reservoir 45 assists in elevating the ozone concentration in the liquid through repeated ozone injection and/or ozone dispersion.

The ozone generator 75 is preferably a high capacity ozone generator. One example of a high capacity ozone generator is the ASTeX 8403 Ozone Generator, manufactured by Applied Science and Technology, Inc., Woburn, Mass., U.S.A. The ASTeX 8403 has an ozone production rating of 160 grams per hour. At this rate a flow of approximately 12 liters/minute and having a concentration of 19% ozone, by weight, can be supported. Another example of a suitable high capacity ozone generator is the Sumitomo GR-RL Ozone Generator, manufactured by Sumitomo Precision Products Co., Ltd., Hyogo, Japan which has an ozone production rating of 180 g/hr. The ozone generator 75 preferably has a capacity of at least 90 or 100 grams per hour, or 110 or 120 grams per hour, with the capacity more preferably of at least 135 grams per hour. In terms of flow rate and concentration, the capacity should be at least 10 liters per minute at 12%, 13%, 14%, 15% (or higher) concentration by weight. Lower flow rate applications, such as with single wafer processing, may have higher concentrations of e.g., 16–19 or greater.

Use of a high capacity ozone generator is especially useful in connection with the methods and apparatus of the present application, because the present methods and apparatus provide for the delivery of ozone independent of the processing fluid.

In previous methods the ozone was dissolved into the aqueous solution in order to make it available for the oxidation process on the surface of the semiconductor wafer. This limited the amount of ozone, which could be delivered to the surface of the semiconductor wafer, to the amount of ozone which could be dissolved into the processing fluid. Correspondingly, there was no incentive to use higher capacity ozone generators, because any excess ozone produced would not be absorbed by the process fluid, and would eventually dissipate and be lost.

FIG. 1, (as well as the other Figures) illustrates various components and connections. While showing preferred designs, the drawings include elements which may or may not be essential to the invention. The elements essential to the invention are set forth in the claims. The drawings show both essential and non-essential elements.

Figure 2:
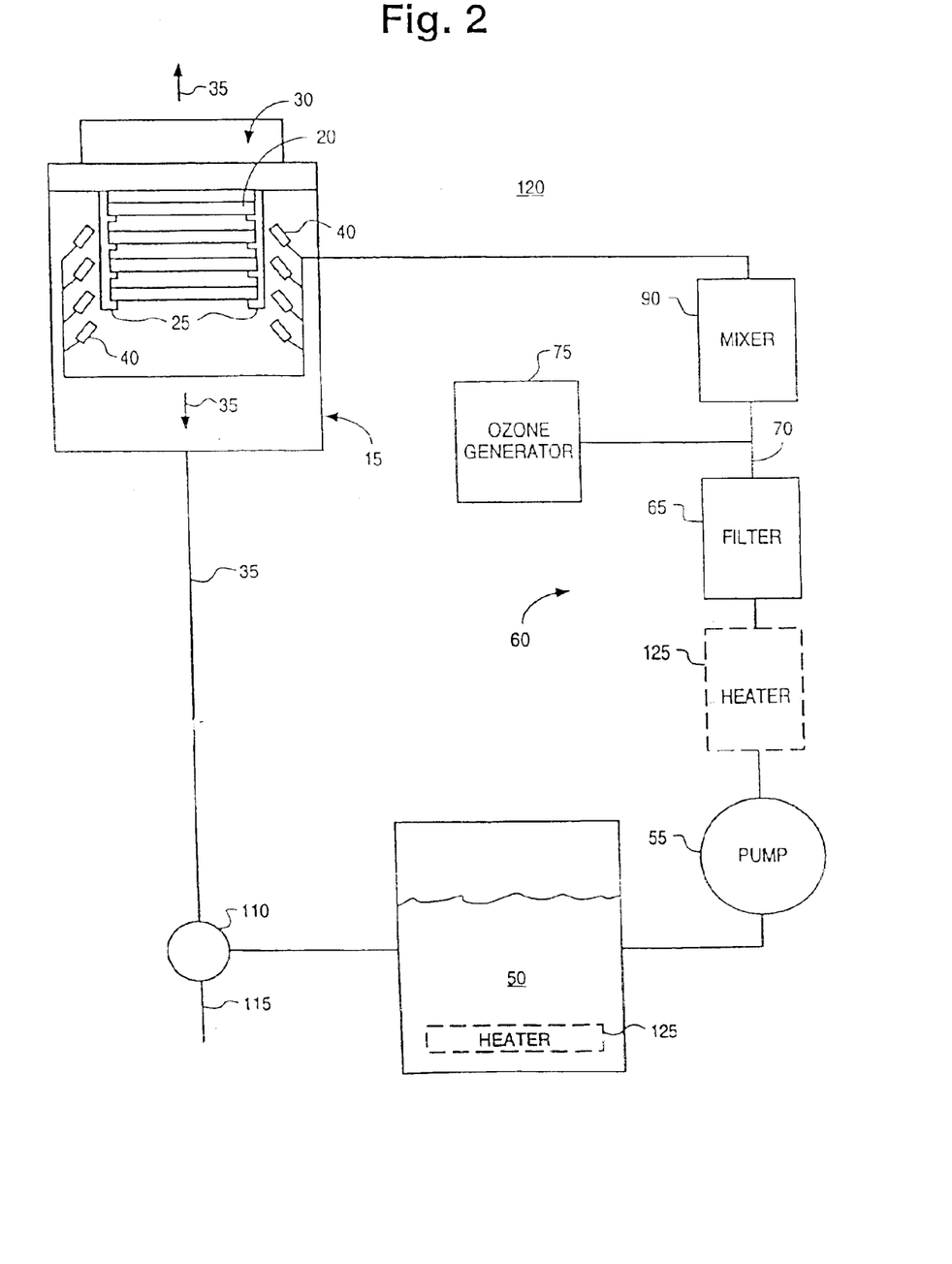
FIG. 2 is a schematic block diagram of one embodiment of an apparatus for treating a semiconductor workpiece in which the semiconductor workpiece is indirectly heated by heating a treatment liquid that is sprayed on the surface of the workpiece.

A further embodiment of a system for delivering a fluid mixture for treating the surface of a semiconductor workpiece is illustrated in FIG. 2. Although the system 120 of FIG. 2 appears to be substantially similar to the system 10 of FIG. 1, there are significant differences. The system 120 of FIG. 2 is based in part on the concept that the heating of the surfaces of the semiconductor workpieces 20 with a heated liquid that is supplied along with a flow of ozone that creates an ozonated atmosphere is highly effective in photoresist stripping, ash removal, and/or cleaning processes. The system 120 therefore preferably includes one or more heaters 125 that are used to heat the treatment liquid so that it is supplied to the surfaces of the semiconductor workpieces at an elevated temperature that accelerates the surface reactions. It is also possible to directly heat the workpieces to stimulate the reactions. Such heating may take place in addition to or instead of the indirect heating of the workpieces through contact with the heated treatment liquid. For example, supports 25 may include heating elements that may be used to heat the workpieces 20. The chamber 15 may include a heater for elevating the temperature of the chamber environment and workpieces.

The preferred treatment liquid is deionized water, since it appears to be required to initiate the cleaning/removal reactions at the workpiece surface, apparently through hydrolysis of the carbon—carbon bonds of organic molecules. However, significant amounts of water can form a continuous film on the semiconductor workpiece surface. This film acts as a diffusion barrier to the ozone, thereby inhibiting reaction rates. The boundary layer thickness is controlled by controlling the rpm of the semiconductor workpiece, vapor delivery, and controlled spraying of the treatment liquid, or a combination of one or more of these techniques. By reducing the boundary layer thickness, the ozone is allowed to diffuse to the surface of the workpieces and react with the organic materials that are to be removed.

Figure 3:
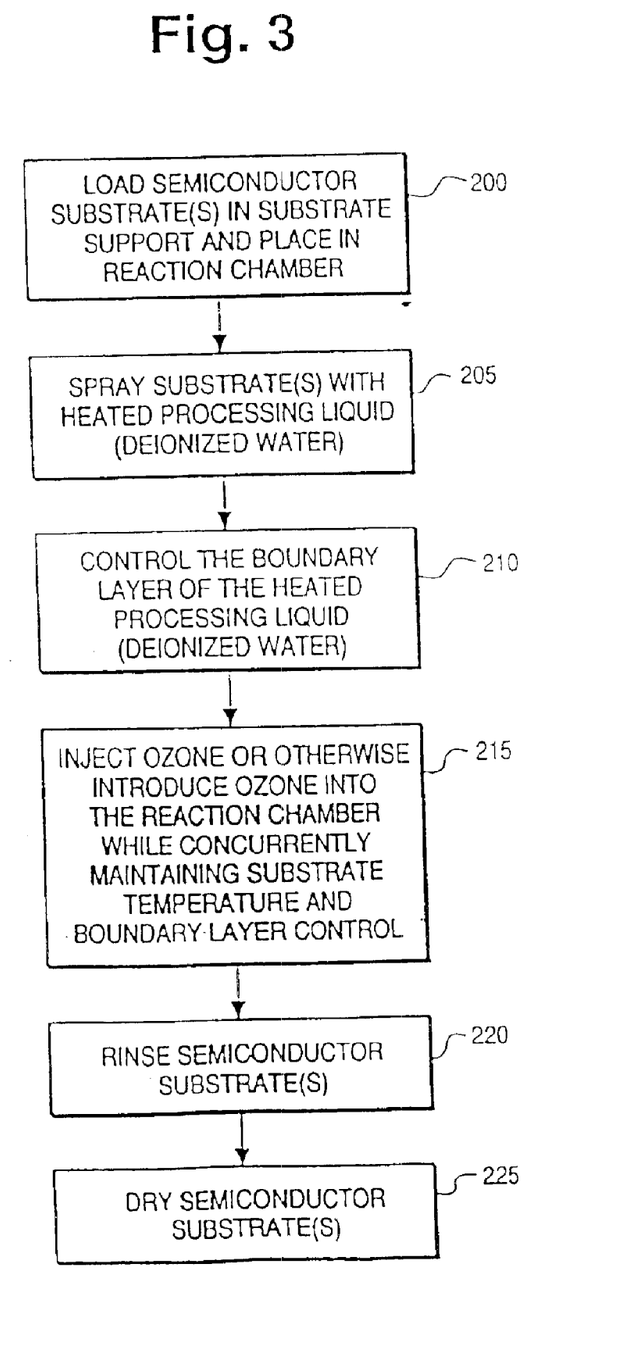
FIG. 3 is a flow diagram illustrating one embodiment of a process flow for treating a semiconductor workpiece with a treatment fluid and ozone.

FIG. 3 illustrates one embodiment of a process that may be implemented in the system of FIG. 2 when the system 120 is used, for example, to strip photoresist from the surfaces of semiconductor workpieces. At step 200, the workpieces 20 that are to be stripped are placed in, for example, a Teflon wafer cassette. This cassette is placed in a closed environment, such as in chamber 15. Chamber 15 and its corresponding components may be constructed based on a well known spray solvent system or spray acid such as those available from Semitool, Inc., of Kalispell, Mont., U.S.A. Alternatively, the semiconductor workpieces 20 may be disposed in chamber 15 in a carrierless manner, with an automated processing system, such as described in U.S. Pat. No. 5,784,797.

At step 205, heated deionized water is sprayed onto the surfaces of the semiconductor workpieces 20. The heated deionized water heats the surfaces of the semiconductor workpieces 20 as well as the enclosed environment of the chamber 15. When the spray is discontinued, a thin liquid film remains on the workpiece surfaces. If the surface is hydrophobic, a surfactant may be added to the deionized water to assist in creating a thin liquid boundary layer on the workpiece surfaces. The surfactant may be used in connection with hydrophilic surfaces as well. Corrosion inhibitors may also be used with the aqueous ozone, thin boundary layer process.

The surface boundary layer of deionized water is controlled at step 210 using one or more techniques. For example, the semiconductor workpieces 20 may be rotated about axis 35 by rotor 30 to thereby generate centripetal accelerations that thin the boundary layer. The flow rate of the deionized water may also be used to control the thickness of the surface boundary layer. Lowering of the flow rate results in decreased boundary layer thickness. Still further, the manner in which the deionized water is injected into the chamber 15 may be used to control the boundary layer thickness. Nozzles 40 may be designed to provide the deionized water as micro-droplets thereby resulting in a thin boundary layer.

At step 215, ozone is injected into the fluid flow path 60 during the water spray, or otherwise provided to the internal chamber environment of chamber 15. If the apparatus of FIG. 2 is utilized, the injection of the ozone continues after the spray has shut off. If the workpiece surface begins to dry, a brief spray is preferably activated to replenish the liquid film on the workpiece surface. This ensures that the exposed workpiece surfaces remain wetted at all times and, further, ensures that the workpiece temperature is and remains elevated at the desired reaction temperature. It has been found that a continuous spray of deionized water having a flow rate that is sufficient to maintain the workpiece surfaces at an elevated temperature, and high rotational speeds (i.e., >300 rpm, between 300 and 800 rpm, or even as high as or greater than 1500 rpm) generates a very thin boundary layer which minimizes the ozone diffusion barrier and thereby leads to an enhanced photoresist stripping rate. As such, the control of the boundary layer thickness is used to regulate the diffusion of reactive ozone to the surface of the wafer.

The surface layer thickness may range from a few molecular layers (e.g., about 1 micron), up to 100 microns, (typically 50–100 microns), or greater.

While ozone has a limited solubility in the heated deionized water, the ozone is able to diffuse through the water and react with photoresist at the liquid/resist interface. It is believed that the presence of the deionized water itself further assists in the reactions by hydrolyzing the carbon—carbon bonds of organic deposits, such as photoresist, on the surface of the wafer. The higher temperature promotes the reaction kinetics while the high concentration of ozone in the gas phase promotes diffusion of ozone through the boundary layer film even though the high temperature of the boundary layer film does not actually have a high concentration of dissolved ozone.

Elevated or higher temperatures means temperatures above ambient or room temperature, that is temperatures above 20 or 25° and up to about 200° C.

Preferred temperature ranges are 25–150°, more preferably 55–120° or 75–115° C., and still more preferably 85–105° C. In the methods described, temperatures of 90–100° C., and preferably centering around 95° C. may be used.

After the semiconductor workpieces 20 have been processed through the reactions of the ozone and/or liquid with the materials to the removed, the workpieces are subject to a rinse at 220 and are dried at step 225. For example, the workpieces may be sprayed with a flow of deionized water during the rinse at step 220. They may then be subject to any one or more known drying techniques thereafter at step 225.

In the described processes, elevated temperatures are used to accelerate the reaction rates at the wafer surface. One manner in which the surface temperature of the wafer may be maximized is to maintain a constant delivery of heated processing liquid, such as water or steam, during the process. The heated processing liquid contacts and heats the wafer during processing. However, such a constant delivery may result in significant waste of the water or other processing liquid. In order to conserve water and achieve the thinnest possible boundary layer, a "pulsed flow" of liquid or steam may be used. In instances in which such a "pulsed flow" fails to maintain the requisite elevated wafer surface temperatures, an alternative manner of maintaining the wafer surface temperature may be needed. One such alternative is the use of a "hot wall" reactor that maintains the wafer surface and processing environment temperatures at the desired level. To this end, the process chamber may be heated by, for example, one or more embedded heated recirculating coils, a heating blanket, irradiation from a thermal source (e.g., and infrared lamp), etc.

In laboratory experiments, a 150 mm silicon wafer coated with 1 micron of photoresist was stripped in accordance with the teachings of the foregoing process. The processing chamber was pre-heated by spraying deionized water that was heated to 95 degrees Celsius into the processing chamber for 10 minutes. During the cleaning process, a pulsed flow of deionized water heated to 95 degrees Celsius was used. The pulsed flow included an "on time" of approximately five seconds followed by an "off time" of 10 seconds. The wafer was rotated at 800 rpm and the pulsed flow of deionized water was sprayed into the processing chamber through nine nozzles at a rate of 3 liters per minute. Ozone was injected into the processing chamber through a separate manifold at a rate of 8 liters per minute at a concentration of 12 percent. The resultant strip rate was 7234 Angstroms/min.

At a higher ozone flow rate, made possible by using a high capacity ozone generator for injecting ozone into the processing chamber at a rate of 12 liters per minute and having a concentration of 19 percent, the resultant strip rates can be further increased to in excess of 8800 Angstroms/minute.

There are many benefits resulting from the use of the semiconductor cleaning processes described above. One of the most significant benefits is that the conventional 4-chem clean process may be reduced to a two-chemical step process while retaining the ability to remove organics, remove particulates, reduce metals and remove silicon dioxide. Process times, chemical consumption, water consumption and waste generation are all also significantly reduced. A further benefit of the foregoing process is its applicability to both FEOL and BEOL wafers and strip processes. Laboratory tests indicate that there is no attack on metals such as aluminum, titanium, tungsten, etc. A known exception is copper, which forms a copper oxide in the presence of ozone. This oxide is not a "hard" and uniform passivation oxide, such as the oxide that forms on metals like aluminum. As a result, the oxide can be readily removed.

A still further benefit is the higher ozone flow rates and concentrations can be used to produce higher strip rates under various processing conditions including lower wafer rotational speeds and reduced temperatures. Use of lower temperatures (between 25 and 75° C. and preferably from 25–65° C. (rather than at e.g., 95° C. as described above) may be useful where higher temperatures are undesirable.

One example where this is beneficial is the use of the process with BEOL wafers, wherein metal corrosion may occur if the metal films are exposed to high temperature de-ionized water. Correspondingly, processing at ambient temperatures may be preferred. The gain in strip rates not realized, as a result of not using higher temperatures, is offset by increases in strip rate due to the increased ozone flow rates and concentrations. The use of higher ozone concentration can offset the loss of kinetic energy from using lower temperatures.

With reference again to FIG. 3, it will be recognized that process steps 205–215 may be executed in a substantially concurrent manner. Additionally, it will be recognized that process steps 205–215 may be sequentially repeated using different processing liquids. In such instances, each of the processing liquids that are used may be specifically tailored to remove a respective set of contaminants. Preferably, however, it is desirable to use as few different processing liquids as possible. By reducing the number of different processing liquids utilized, the overall cleaning process is simplified and reducing the number of different processing liquids utilized minimizes chemical consumption.

A single processing liquid may be used to remove organic contaminants, metals, and particles in a single cycle of process steps 205–215. The processing liquid is comprised of a solution of deionized water and one or more compounds, such as HF or HCl, so as to form an acidic processing liquid solution.

The use of a hydrofluoric acid solution in the process steps set forth at 205–215 provides numerous advantages, including the following:

1. Removal of organic contaminants—The oxidation capability of the process has been demonstrated repeatedly on photoresist. Strip rates often exceed 8800 A/minute. Considering the fact that in cleaning applications, organic contamination is generally on the molecular level, the disclosed process has ample oxidation capacity.

2. Removal of oxide and regeneration of a controlled chemical oxide—Depending on the temperature of the solution and the concentration of HF in solution, a specific etch rate may be defined. However, the ozone will diffuse through the controlled boundary layer and regenerate the oxide to prevent the wafer from becoming hydrophobic. A 500:1 $H_2O$:HF mixture at 65 degrees C. will etch $SiO_2$ at a rate of about 6 A/minute. The same solution at 25 degrees C will etch $SiO_2$ at about 2 A/minute. A typical "native" oxide is generally self limiting at a thickness of 8–12 A, which is generally the targeted thickness for the oxide removal.

3. Removal of particles—Although the acidic solutions do not have the favorable zeta potential present in the SC1 clean noted above, particle removal in the disclosed process with an HF processing liquid has still been shown to be significant, as it uses the same removal mechanism of etching and regenerating the oxide surface.

4. Removal of metals—In laboratory experiments, wafers were intentionally contaminated with iron, nickel and copper. The disclosed process with an HF containing processing liquid showed a reduction in metals of over three orders of magnitude. As an added enhancement, HCl can be used in place of the HF to accomplish the metals removal, although this does not have the same degree of oxide and particle removal capability. The combination of HF and HCl is a further benefit, as each of these chemistries has significant metals removal capability, but the regeneration of the oxide surface in conjunction with the conversion of metals to metallic oxides and the symbiotic interaction of the two acid halides creates an exceptionally favorable environment for metal removal.

5. An oxide-free (hydrophobic) surface may be generated, if desired, by using a final HF step in an immersion cell or by use of an HF vapor step after the metals removal.

With the use of HF and ozone, the boundary layer is preferably maintained thick enough to achieve good etch uniformity, by selecting flow rates of liquid onto the workpiece surface, and removal rates of liquid from the workpiece surface. The boundary layer of the liquid on the workpiece surface is preferably maintained thick enough so that the etch uniformity is on the order of less than 5%, and preferably less than 3% or 2% (3-sigma divided by the mean).

In the HF and ozone process, the ozone concentration is preferably about 3–35% or 10–20% by weight (in oxygen). The ozone concentration is largely dependent on the etch rate of the aqueous HF solution used. When processing silicon, it is desirable that the silicon surface not be allowed to go hydrophobic, indicating the complete etching of the passivating silicon dioxide surface. HF concentration used is typically 0.001 to 10% or 0.01 to 1.0% (by weight). In general, the lower concentrations are preferred, with a concentration of about 0.1% providing very good cleaning performance (with an etch rate of 8 A of thermal oxide per minute at 95 C). The HF solution may include hydrochloric acid to enhance metal removal capability. If used, the HCl typically has a range of concentrations similar to the ranges described above for HF.

In the HF and ozone process, a temperature range from 0° C. up to 100° C. may be used. Higher temperatures may be used if the process is conducted under pressure. Particle removal capability of this process is enhanced at elevated temperatures. At ambient temperature, the particle removal efficiency of dried silicon dioxide slurry particles with starting counts of around 60,000 particles larger than 0.15 microns, was about 95%. At 65° C., this efficiency increased to 99%. At 95° C., the efficiency increased to 99.7%. Although this may appear to be a slight improvement, the difference in final particle count went from 3000 to 300 to about 100 particles, which can be very significant in the manufacture of semiconductor devices.

The HF and ozone process may be included as part of a cleaning sequence, for example: 3:00 (minutes) of HF/O3>3:00 SC1>3:00 HF/O3. In this sequence, the cleaning efficiency increased to over 99.9%. In contrast, the SC1 alone had a cleaning efficiency of only 50% or less. Similar results have been achieved when cleaning silicon nitride particles as well.

The steps and parameters described above for the ozone processes apply as well to the ozone with HF and ozone process. These processes may be carried out on batches of workpieces in apparatus such as described in U.S. Pat. No. 5,544,421, or on individual workpieces in an apparatus such as described in PCT/US99/05676.

Typical chemical application times are in the range of 1:00 to 5:00. Compared to a 4-chem clean process time of around 20:00, the disclosed process with an HF and/or HCl containing processing liquid becomes very attractive. Typical $H_2O$:HF:HCl concentration ratios are on the order of 500:1:1 to 50:1:1, with and without HF and/or HCl. Higher concentrations are possible, but the economic benefits are diminished. It is important to note that gaseous HF or HCl could be injected into water to create the desired cleaning chemistry as well. Due to differences in processor configurations and desired cleaning requirements, definition of specific cleaning process parameters will vary based on these differences and requirements.

The process benefits include the following:
1. Reduction in the amount and types of chemicals used in the cleaning process.
2. Reduction in water consumption by the elimination of the numerous intermediate rinse steps required.
3. Reduction in process time.
4. Simplification of process hardware.

The disclosed processes are counter-intuitive. Efforts have been made for a number of years to replace hydrogen peroxide with ozone in chemistries such as SC1 and, to a lesser degree, SC2. These efforts have largely failed because they have not controlled the boundary layer and have not introduced the ozone in such a manner that diffusion through the boundary layer is the controlling mechanism instead of dissolution into the boundary layer. While the cleaning efficiency of conventional solutions is greatly enhanced by increasing temperature, it is recognized that the solubility of ozone in a given liquid solution is inversely proportional to the temperature of the solution. The solubility of ozone in water at 1 degrees Celsius is approximately 100 ppm. At 60 degrees Celsius, this solubility drops to less than 5 ppm. At elevated temperatures, the ozone concentration is thus insufficient to passivate (oxidize) a silicon wafer surface quickly enough to ensure that pitting of the silicon surface will not occur. Thus the two mechanisms are in conflict with one another when attempting to optimize process performance.

Tests have demonstrated that by applying the boundary layer control techniques explained in connection with the presently disclosed processes, it is possible to process silicon wafers using a 4:1 water:ammonium hydroxide solution at 95 C and experience an increase surface roughness (RMS) of less than 2 angstroms. When this same solution is applied in an immersion system or in a conventional spray system, RMS surface roughness as measured by atomic force microscopy increases by more than 20 angstroms and the maximum surface roughness exceeds 190 angstroms. Additionally, while a conventional process will pit the surface to such a degree as to render the surface unreadable by a light-scattering particle counter, the boundary controlled technique has actually shown particle reductions of up to 50% on the wafer surface.

In the case of oxidizing and removing organic contamination, conventional aqueous ozone processes show a strip rate on photoresist (a hydrocarbon film) of around 200–700 angstroms per minute. In the boundary layer controlled system of the disclosed processes, the rate is accelerated to 2500 to 8800. angstroms per minute in a spray controlled boundary layer, or higher when the boundary layer is generated and controlled using steam at 15 psi and 126 degrees C.

The disclosed processes are suitable for use in a wide range of microelectronic fabrication applications. One issue which is of concern in the manufacture of semiconductor devices is reflective notching. In order to expose a pattern on a semiconductor wafer, the wafer is coated with a photoactive compound called photoresist. The resistance film is exposed to a light pattern, thereby "exposing" the regions to which the light is conveyed. However, since topographic features may exist under the photoresist, it is possible for the light to pass through the photoresist and reflect off of a topographic feature. This results in resist exposure in an undesirable region. This phenomenon is known as "reflective notching." As device density increases, reflective notching becomes more of a problem.

A similar issue arises as a result of the reflectance normal to the incident angle of irradiation. Such reflectance can create distortions in the exposure beam through the phenomenon of standing wave formation, thereby resulting in pattern distortion in the photoresist.

In order to combat these phenomena, the use of anti-reflective coating layers has become common. The photoresist films are typically deposited either on top of or below an anti-reflective coating layer. Since both the photoresist layer and the anti-reflective coating layer are merely "temporary" layers used in intermediate fabrication steps, they must be removed after such intermediate fabrication steps are completed.

It has been found that the process of FIG. 3 may be used with a processing liquid comprised of water and ammonium hydroxide to remove both the photoresist and the anti-reflective coating in a single processing step (e.g., the steps illustrated at 210–215). Although this has been demonstrated at concentrations between 0.02% and 0.04% ammonium hydroxide by weight in water, other concentrations are also considered to be viable.

The process for concurrently removing photoresist and the corresponding anti-reflective layer is not necessarily restricted to processing liquids that include ammonium hydroxide. Rather, the principal goal of the additive is to elevate the pH of the solution that is sprayed onto the wafer surface. Preferably, the pH should be raised so that it is between about 8.5 and 11. Although bases such as sodium hydroxide and/or potassium hydroxide may be used for such removal, they are deemed to be less desirable due to concerns over mobile ion contamination. However, chemistries such as TMAH (tetra-methyl ammonium hydroxide) are suitable and do not elicit the same a mobile ion contamination concerns. Ionized water that is rich in hydroxyl radicals may also be used.

The dilute ammonium hydroxide solution may be applied in the process in any number of manners. For example, syringe pumps, or other precision chemical applicators, can be used to enable single-use of the solution stream. In such an embodiment, it becomes possible to strip the photoresist using a deionized water stream with ozone, and can conclude the strip with a brief period during which ammonium hydroxide is injected into the aqueous stream. This assists in minimizing chemical usage and waste generation. The application apparatus may also be capable of monitoring and controlling the pH the using the appropriate sensors and actuators, for example, by use of microprocessor control.

Figure 4:
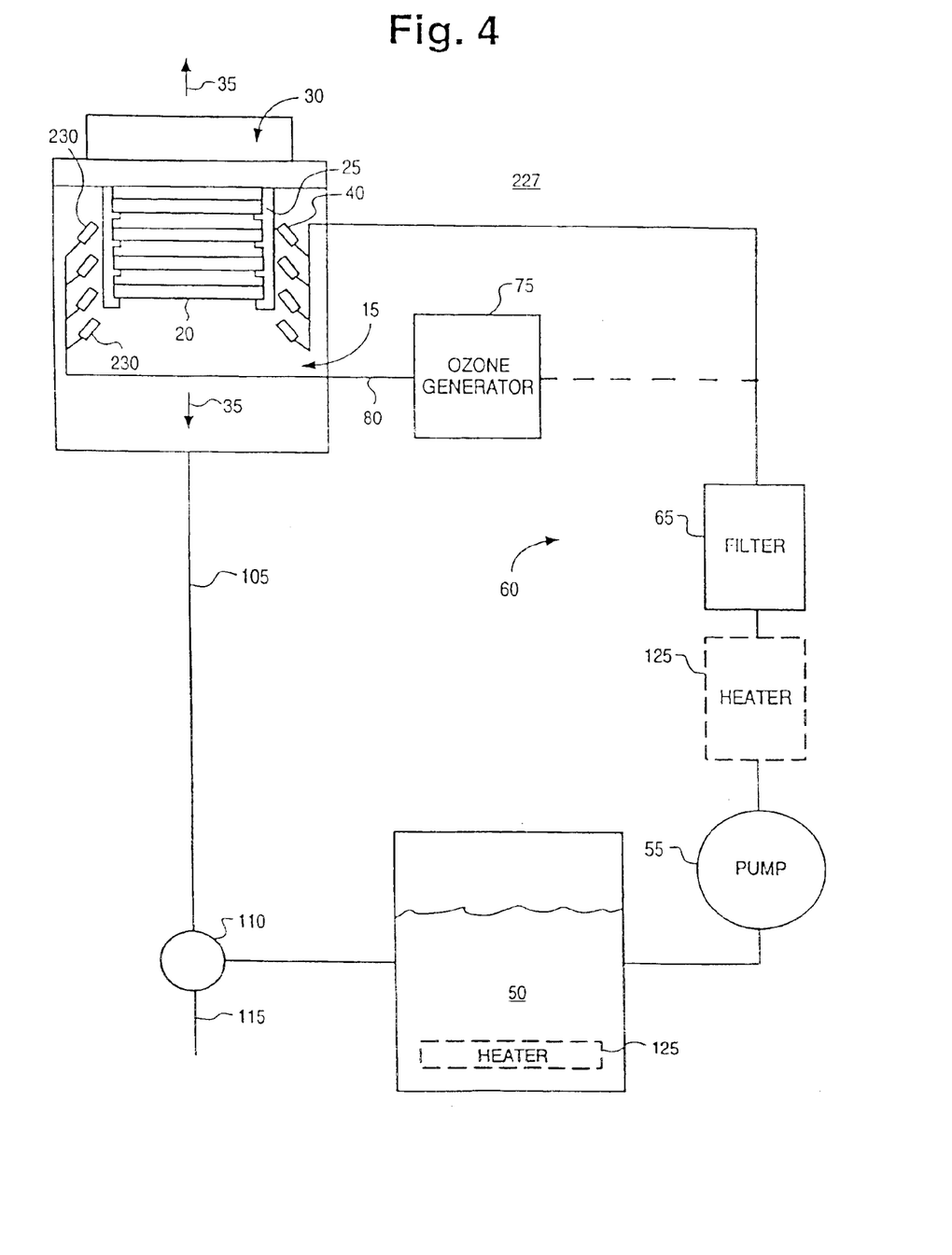
FIG. 4 is a schematic block diagram of an alternative embodiment of the system set forth in FIG. 2 wherein the ozone and treatment fluid are provided to the semiconductor workpiece along different flow paths.

With reference to FIG. 4, there is shown yet a further embodiment of the ozone treatment system 227. In the embodiment of FIG. 4, one or more nozzles 230 are disposed within the treatment chamber 15 to conduct ozone from ozone generator 75 directly into the reaction environment. The heated treatment fluid is provided to the chamber 15 through nozzles 40 that receive the treatment fluid, such as heated deionized water, through a supply line that is separate from the ozone supply line. As such, injection of ozone in fluid path 60 is optional.

Figure 5:
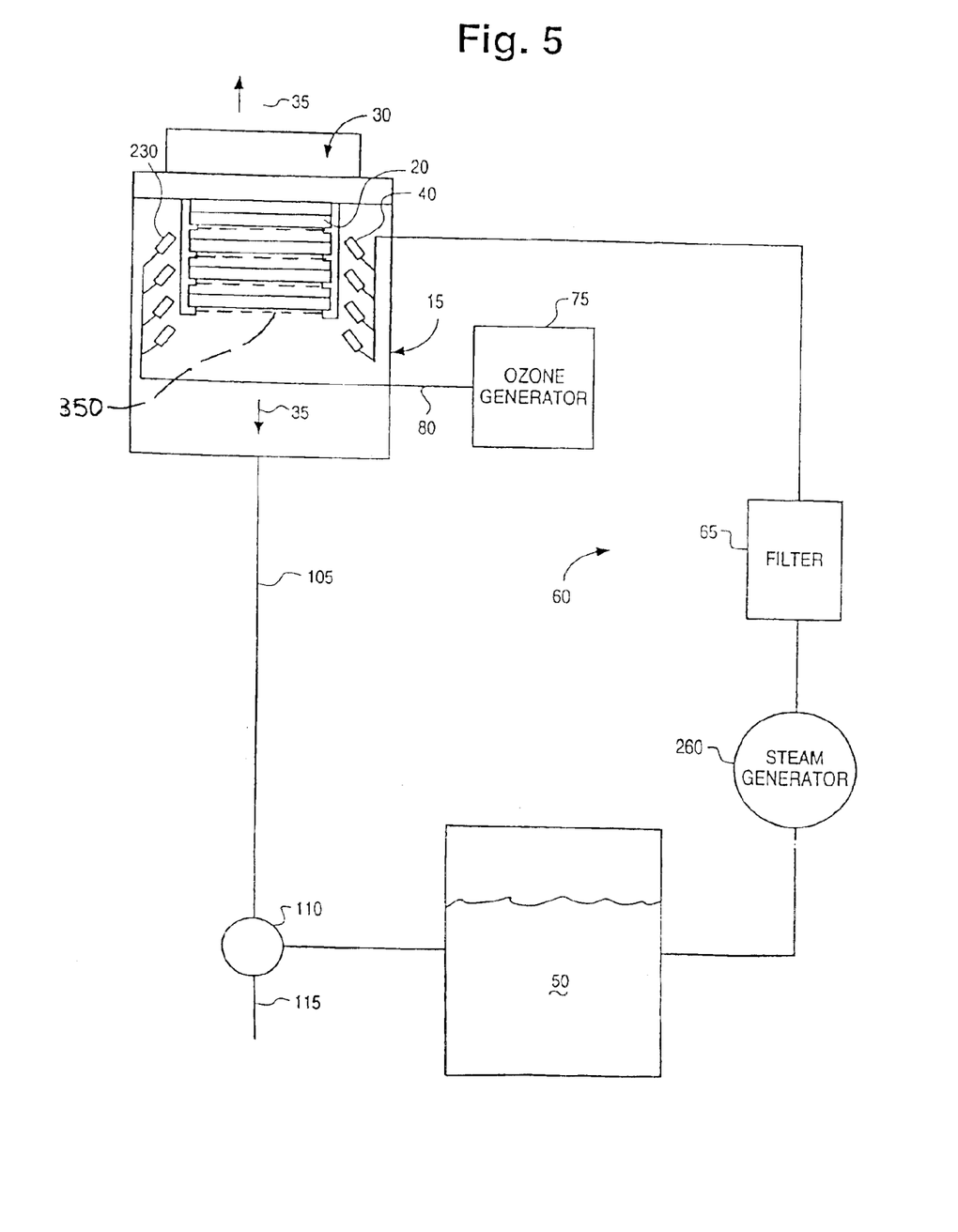
FIG. 5 is a schematic block diagram of an embodiment of an apparatus for treating a semiconductor workpiece in which pressurized steam and ozone are provided in a pressurized chamber containing a semiconductor workpiece.

Another embodiment of an ozone treatment system is shown generally at 250 in FIG. 5. In the system 250, a steam boiler 260 that supplies saturated steam under pressure to the process chamber 15 has replaced the pump mechanism. The reaction chamber 15 is preferably sealed to thereby form a pressurized atmosphere for the reactions. For example, saturated steam at 126 degrees Celsius could be generated by steam boiler 260 and supplied to reaction chamber 15 to generate a pressure of 35 psia therein during the workpiece processing. Ozone may be directly injected into the chamber 15 as shown, and/or may be injected into the path 60 for concurrent supply with the steam. Using the system architecture of this embodiment, it is thus possible to achieve semiconductor workpiece surface temperatures in excess of 100 degrees Celsius, thereby further accelerating the reaction kinetics. The steam generator in FIG. 5 may be replaced with a heater(s) as shown in FIGS. 1–4. While FIGS. 4 and 5 show the fluid and ozone delivered via separate nozzles 40, they may also be delivered from the same nozzles, using appropriate valves.

Figure 6:
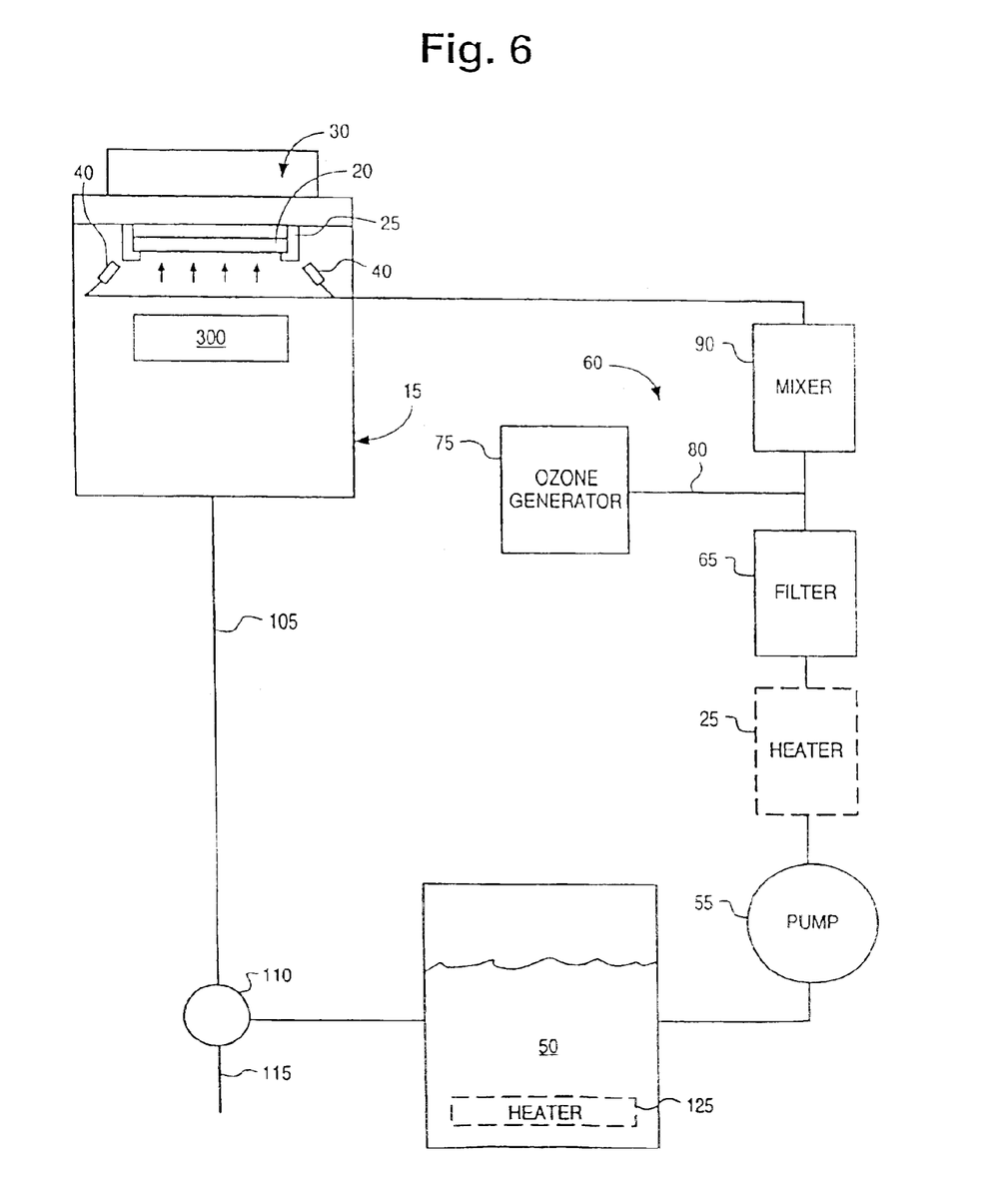
FIG. 6 is a schematic block diagram of an embodiment of an apparatus for treating a semiconductor workpiece in which an ultra-violet lamp is used to enhance the kinetic reactions at the surface of the workpiece.

A still further enhancement that may be made to any one of the foregoing systems is illustrated in FIG. 6. In this embodiment, an ultra-violet or infrared lamp 300 is used to irradiate the surface of the semiconductor workpiece 20 during processing. Such irradiation further enhances the reaction kinetics. Although this irradiation technique is applicable to batch semiconductor workpiece processing, it is more easily and economically implemented in the illustrated single wafer processing environment where the workpiece is more easily completely exposed to the UV radiation. Megasonic or ultrasonic nozzles 40 may also be used.

Figure 7:
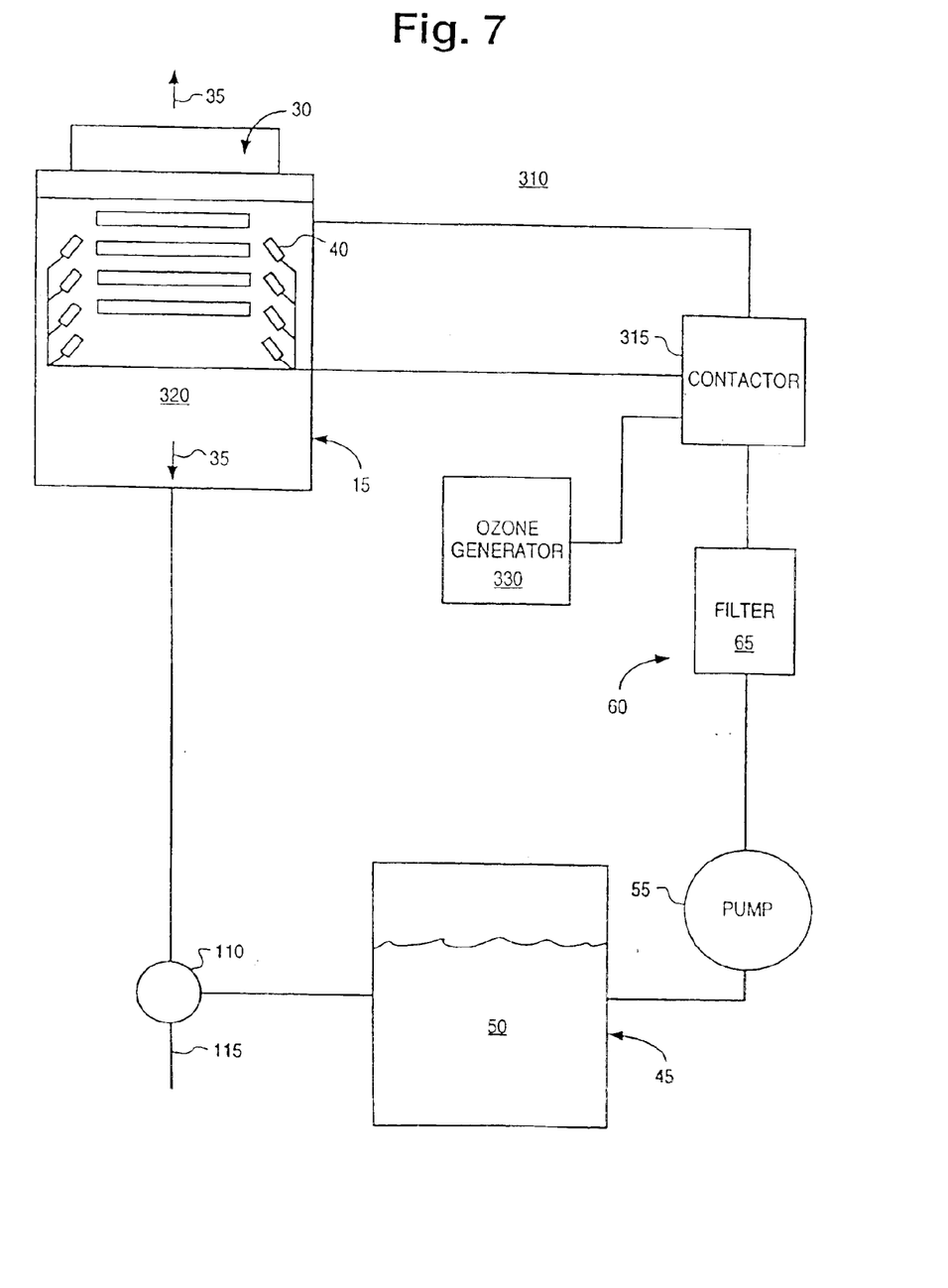
FIG. 7 is a schematic block diagram of an embodiment of an apparatus for treating a semiconductor workpiece in which liquid gas contactors are used to enhance the kinetic reactions at the surface of the workpiece.

With reference to FIG. 7, a further system 310 for implementing one or more of the foregoing processes is set forth. Of particular note in system 310 is the use of one or more liquid-gas contactors 315 that are used to promote the dissolution of ozone into the aqueous stream. Such contactors are of particular benefit when the temperature of the processing liquid is, for example, at or near ambient. Such low temperatures may be required to control corrosion that may be promoted on films such as aluminum/silicon/copper.

The contactor 315 is preferably of a parallel counter-flow design in which liquid is introduced into one end and the ozone gas is introduced into the opposite end. Such contactors are available from e.g., W. L. Gore Corporation, Newark, Del., USA. These contactors operate under pressure, typically from about 1 to 4 atmospheres (gauge). The undissolved gas exiting the contactor 315 may be optionally directed to the process chamber 320 to minimize gas losses. However, the ozone supply 330 for the contactor 315 may or may not be the same as the supply for direct delivery to the process chamber 320.

As described, the ozone gas may be separately sprayed, or otherwise introduced as a gas into the process chamber, where it can diffuse through the liquid boundary layer on the workpiece. The fluid is preferably heated and sprayed or otherwise applied to the workpiece, without ozone injected into the fluid before the fluid is applied to the workpiece.

Alternatively, the ozone may be injected into the fluid, and then the ozone containing fluid applied to the workpiece. In this embodiment, if the fluid is heated, the heating preferably is performed before the ozone is injected into the fluid, to reduce the amount of ozone breakdown in the fluid during the fluid heating. Typically, due to the larger amounts of ozone desired to be injected into the fluid, and the low solubility of the ozone gas in the heated fluid, the fluid will contain some dissolved ozone, and may also contain ozone bubbles.

It is also possible to use aspects of both embodiments, that is to introduce ozone gas directly into the process chamber, and to also introduce ozone into the fluid before the fluid is delivered into the process chamber. Thus, various methods may be used for introducing ozone into the chamber.

The presently disclosed apparatus and methods may be used to treat workpieces beyond the semiconductor workpieces described above. For example, other workpieces, such as flat panel displays, hard disk media, CD glass, etc, may also have their surfaces treated using the foregoing apparatus and methods.

Although the preferred treatment liquid for the disclosed application is deionized water, other treatment liquids may also be used. For example, acidic and basic solutions may be used, depending on the particular surface to be treated and the material that is to be removed. Treatment liquids comprising sulfuric acid, hydrochloric acid, and ammonium hydroxide may be useful in various applications.

As described, one aspect of the process is the use of steam (water vapor at temperatures exceeding 100 C) to enhance the strip rate of photoresist in the presence of an ozone environment. Preliminary testing shows that a process using hot water at 95 C produces a photoresist strip rate of around 3000–4000 angstroms per minute. Performing a similar process using steam at 120–130 C results in a strip rate of around 7000–8000 angstroms per minute.

However, the resultant strip rate is not sustainable.

The high strip rate is achieved only when the steam condenses on the wafer surface. The wafer temperature rapidly approaches thermal equilibrium with the steam, and as equilibrium is achieved, there is no longer a thermal gradient to promote the formation of the condensate film. This results in the loss of the liquid boundary layer on the wafer surface. The boundary layer appears to be essential to promote the oxidation of the organic materials on the wafer surface. The absence of the liquid film results in a significant drop in the strip rate on photoresist.

Additionally, once the steam ceases to condense on the wafer surface, the reaction environment experiences the elimination of an energy source to drive the reaction kinetics. As steam condenses on the wafer surface, it must relinquish the heat of vaporization, which is approximately 540 calories per gram. This energy then becomes available to promote other reactions such as the oxidation of carbon compounds in the presence of ozone or oxygen free radicals.

In view of these experimental observations, a method for maintaining the temperature of a surface such as a semiconductor wafer surface, is provided to ensure that condensation from a steam environment continues indefinitely, thereby enabling the use of steam in applications such as photoresist strip in the presence of ozone. Thus the formation of the liquid boundary layer is assured, as well as the release of significant amounts of energy as the steam condenses.

To accomplish this, the wafer surface must be maintained at a temperature lower than that of the steam delivered to the process chamber. This may be achieved by attaching the wafer to a temperature-controlled surface or plate 350 which will act as a heat sink. This surface may then be temperature controlled either through the use of cooling coils, a solid-state heat exchanger, or other means.

In a preferred embodiment, a temperature-controlled stream of liquid is delivered to the back surface of a wafer, while steam and ozone are delivered to an enclosed process region and the steam is allowed to condense on the wafer surface. The wafer may be rotated to promote uniform distribution of the boundary layer, as well as helping to define the thickness of the boundary layer through centrifugal force. However, rotation is not an absolute requirement. The cooling stream must be at a temperature lower than the steam. If the cooling stream is water, a temperature of 75 or 85–95 C is preferably used, with steam temperatures in excess of 100 C.

In another embodiment, and one which is relatively easy to implement in a batch process, pulsed spray of cooling liquid is applied periodically to reduce the wafer temperature. Steam delivery may either be continuous or pulsed as well.

The wafer may be in any orientation and additives such as hydrofluoric acid, ammonium hydroxide or some other chemical may be added to the system to promote the cleaning of the surface or the removal of specific classes of materials other than or in addition to organic materials.

This process enables the use of temperatures greater than 100 C to promote reaction kinetics in the water/ozone system for the purpose of removing organic or other materials from a surface. It helps ensure the continuous formation of a condensate film by preventing the surface from achieving thermal equilibrium with the steam. It also takes advantage of the liberated heat of vaporization in order to promote reaction rates and potentially allow the removal of more difficult materials which may require more energy than can be readily delivered in a hot water process.

What is claimed is:

1. A method for processing a workpiece, comprising the steps of:
   providing a liquid at a temperature in the range of about 25–150° C. onto a surface of the workpiece;
   introducing ozone into an environment containing the workpiece at a rate of at least 90 grams per hour;
   controlling a thickness of the liquid on the workpiece so as to form a liquid layer that allows for diffusion of the ozone through the layer to the surface of the workpiece; and
   reacting the ozone at the surface of the workpiece, to process the workpiece.

2. The method of claim 1 where the ozone is introduced at a rate of at least 130 grams per hour.

3. The method of claim 1 where the ozone is introduced at a flow rate of at least 10 lpm and a concentration of at least 10% by weight.

4. The method of claim 1 wherein the liquid comprises deionized water.

5. The method of claim 4 wherein the deionized water is superheated.

6. The method of claim 1 wherein the liquid includes sulfuric acid, hydrochloric acid, ammonium hydroxide, or deionized water.

7. The method of claim 1 wherein the step of controlling comprises the step of rotating the workpiece.

8. The method of claim 1 wherein the step of controlling comprises the step of rotating the workpiece at a rotation rate equal to or greater than about 300 rpm.

9. The method of claim 1 wherein the step of controlling comprises adding a surfactant to the liquid.

10. The method of claim 1 wherein the step of controlling comprises the step of spraying the liquid onto the surface of the workpiece at a controlled flow rate.

11. The method of claim 1 wherein the liquid includes water and HF at a concentration ratio of between about 50:1 and 500:1.

12. The method of claim 1 wherein the liquid includes water and HCl at a concentration ratio of between about 50:1 and 500:1.

13. The method of claim 1 wherein the liquid includes water, HF and HCl at a concentration ratio of between about 50:1:1 and 500:1:1.

14. The method of claim 1 wherein the liquid is at a temperature in the range of 55–120° C.

15. The method of claim 1 wherein the liquid is range of 75–115° C.

16. A method for cleaning a surface of a workpiece, comprising the steps of:
   providing a heated liquid solution of water and at least one of HF and HCl onto the surface of the workpiece, with the heated solution assisting in maintaining the workpiece at a temperature in the range of about 25–150° C.;
   introducing ozone into an environment containing the workpiece at a rate of at least 90 grams per hour;
   controlling a thickness of the heated liquid solution to form a thin liquid boundary layer on the surface of the workpiece to allow diffusion of the ozone through the boundary layer for reaction at the surface of the workpiece, to clean the workpiece.

17. A method for processing a workpiece, comprising the steps of:
   providing an aqueous liquid boundary layer onto a surface of the workpiece with the liquid boundary layer at a temperature in the range of 55–120° C.;
   introducing ozone into an environment containing the workpiece at a rate of at least 90 grams per hour;
   controlling a thickness of the aqueous liquid boundary layer to allow for diffusion of the ozone through the boundary layer and a reaction at the surface of the workpiece, to process the workpiece.

18. A system for processing a workpiece, comprising:
   a process chamber;
   means for forming a liquid boundary layer on the workpiece;
   an ozone supply system for providing ozone directly or indirectly into the chamber, and having a capacity of at least 90 grams per hour, whereby the ozone can diffuse through the boundary layer to a surface of the workpiece; and
   a heater for heating the aqueous liquid to a temperature in the range of 25–150° C. before the liquid is provided onto the workpiece.

19. The system of claim 18 with the ozone supply system comprising a contactor for receiving the ozone and the liquid.

20. The system of claim 18 further comprising a rotor assembly in the chamber for rotating the workpiece.

21. The system of claim 18 where the ozone supply system generates a flow of ozone at a flow rate of at least 10 lpm and a concentration of at least 10% by weight.

22. The system of claim 18 where the heater comprises a steam boiler.

23. The system of claim 18 further comprising means for controlling a thickness of a liquid layer on the workpiece, including at least one of:
   a rotor for rotating the workpiece;
   a fluid flow controller or one or more nozzles adapted to generate fine droplets of the liquid.

24. The method of claim 18, wherein the liquid is range of 75–115° C.

25. The method of claim 18 wherein the liquid is heated to a temperature in the range of 85–105° C.

* * * * *